(12) United States Patent
Meyer-Berg

(10) Patent No.: US 6,359,790 B1
(45) Date of Patent: Mar. 19, 2002

(54) MULTICHIP MODULE HAVING A SILICON CARRIER SUBSTRATE

(75) Inventor: Georg Meyer-Berg, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/609,508

(22) Filed: Jul. 3, 2000

(30) Foreign Application Priority Data

Jul. 1, 1999 (DE) .......................................... 199 30 308

(51) Int. Cl.$^7$ .............................. H05K 1/11; H05K 1/14
(52) U.S. Cl. ...................... 361/803; 361/743; 361/767; 174/263
(58) Field of Search ................................. 361/803, 761, 361/764, 783, 790, 820, 767, 715, 736, 743, 765, 780, 807, 776, 720, 748; 174/260, 258, 263

(56) References Cited

U.S. PATENT DOCUMENTS

| 4,807,021 A | * | 2/1989 | Okumura | 357/75 |
| 4,868,636 A | * | 9/1989 | Gross | 357/71 |
| 5,222,014 A | * | 6/1993 | Lin | 361/414 |
| 5,367,435 A | * | 11/1994 | Andros et al. | 361/749 |
| 5,715,144 A | * | 2/1998 | Ameen et al. | 361/790 |
| 6,087,597 A | * | 7/2000 | Shimada et al. | 174/263 |

FOREIGN PATENT DOCUMENTS

DE 198 30 158 4/1999

OTHER PUBLICATIONS

International Publication WO 98/18303 (Brown et al.), dated Apr. 30, 1998.

* cited by examiner

Primary Examiner—Jayprakash N. Gandhi
Assistant Examiner—Hung Bui
(74) Attorney, Agent, or Firm—Herbert L. Lerner; Laurence A. Greenberg; Werner H. Stemer

(57) ABSTRACT

Semiconductor chips are mounted in flip-chip technology on the multilayer wiring of the silicon carrier substrate. The underside of the substrate is provided with soldering contacts in the form of solder agglomerations forming a ball grid array (BGA). The underside is structured such that a cavity which narrows in the shape of a funnel from the underside up to the lowest conductor track plane is formed for each soldering contact. The cavities are each filled by the respective solder agglomeration and the solder agglomeration itself makes contact with the multilayer wiring.

5 Claims, 1 Drawing Sheet

MULTICHIP MODULE HAVING A SILICON CARRIER SUBSTRATE

BACKGROUND OF THE INVENTION

Field of the Invention

The invention relates to a multichip module.

In the design of complex electronic systems with a plurality of semiconductor chips, problems appertaining to the connection and packaging technology are increasingly coming to the fore in the course of reducing the chip connection spacings. The conventional construction, in which the chips are housed individually, provided with connections and then mounted individually on a printed circuit board, is not optimal in many cases owing to the relatively high space requirement and owing to the wiring required between the individual chips.

It has therefore become increasingly more common to produce the system in the form of multichip modules, in which a substrate with high-density multilayer wiring, on which the chips are fitted, serves as an intermediate carrier substrate for joint integration of a plurality of chips in a next higher architectural level of the system design. Suitable materials for the intermediate carrier substrate nowadays include, in addition to conventional plastic, principally ceramic, metal and silicon. Silicon and ceramic are problematic, however, with regard to combination with the space-saving connection technology BGA (ball grid array), since the holes required for the through-plating from the multilayer wiring on the mounting side to the large-area solder agglomerations on the underside can be produced only with difficulty for a ceramic substrate for example.

International PCT patent publication WO 98/18303 has disclosed a multichip module with a special design and connection system based on silicon substrates. That document proposes dividing the intermediate carrier substrate on the one hand into small pallets with high-density wiring, on each of which preferably an individual chip is arranged using flip-chip technology, and on the other hand into a larger board with recesses for the chips of the individual pallets. The pallets with the chips are thus themselves soldered onto the contacts of the board once again using flip-chip technology. In order to obtain the most uniform thermal expansion possible, it is proposed to produce the pallets and the board from the same material as the chips, that is to say from silicon. However, the prior art design results in space not being used optimally, since the pallets are somewhat larger than the chips themselves, and is relatively costly in terms of production on account of the division or doubling of the substrate into pallet and board.

SUMMARY OF THE INVENTION

The object of the invention is to provide a multichip module which overcomes the above-noted deficiencies and disadvantages of the prior art devices and methods of this general kind.

With the above and other objects in view there is provided, in accordance with the invention, a multichip module, comprising:

a silicon carrier substrate having a mounting side and an underside;

multilayer wiring applied to the mounting side of the carrier substrate, the multilayer wiring including a first, uppermost conductor track plane and a lowermost conductor track plane;

at least one semiconductor chip in contact with the first, uppermost conductor track plane and flip-chip mounted thereon via a plurality of small solder balls; and the underside of the carrier substrate having formed therein a plurality of cavities narrowing in a funnel shape from the underside and to the lowermost conductor track plane; and a plurality of soldering contacts each in the form of a solder agglomeration disposed in a respective one of the cavities and extending from the underside to the lowermost conductor track plane, for electrically connecting the multichip module to a mounting rack.

In accordance with an added feature of the invention, the solder agglomerations are areally arranged ball grid array solder agglomerations.

In accordance with an additional feature of the invention, the cavities having inclined sides each covered with an insulating layer composed of a poorly planarizing material, such as, for example, photoimide.

In accordance with a concomitant feature of the invention, there is also provided a multichip module assembly with two of the above-described multichip modules arranged one above the other in a sandwich type relationship. The solder agglomerations of the upper module are arranged only in outer region of the carrier substrate and are soldered directly on the multilayer wiring of the lower module.

Other features which are considered as characteristic for the invention are set forth in the appended claims.

Although the invention is illustrated and described herein as embodied in a multichip module having a silicon carrier substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
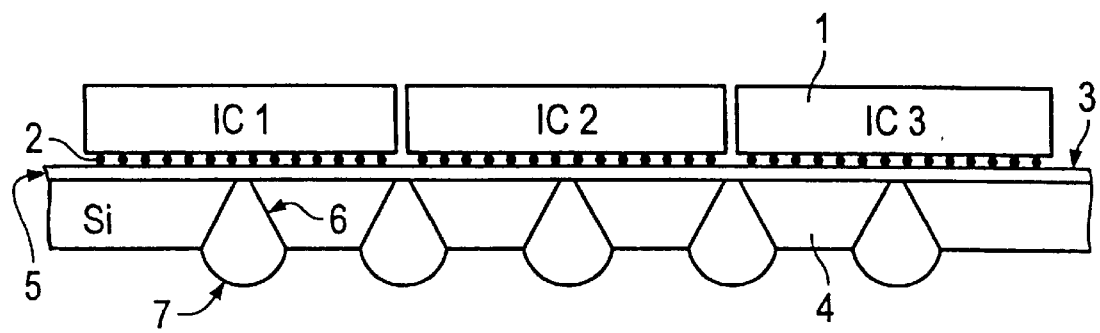
FIG. 1 is a diagrammatic sectional side view taken through a multichip module according to the invention.

Referring now to the figures of the drawing in detail and first, particularly, to FIG. 1 thereof, there is seen an exemplary multichip module with three semiconductor chips 1, which are each soldered by their active side on the first, uppermost conductor track plane 3 of the silicon carrier substrate 4 by means of small solder balls 2. The multilayer wiring 5 is formed, in a manner known per se, as a sequence of structured metal planes which are electrically isolated from one another by an organic dielectric. The connections between the conductor track planes are thereby established in a targeted manner for example by means of via holes produced lithographically in the dielectric. Multilayer wiring with alternate Cu—BCB (diphenylcyclobutene) planes is preferred. Of course, in addition to the chips 1 illustrated in FIG. 1, further electronic components can also be soldered (using SMD technology) on the multilayer wiring 5. The multilayer wiring 5 has a typical thickness of approximately 50 $\mu$m, while the actual silicon carrier substrate 4 may typically have a thickness of a few hundred microns.

The solder agglomerations 7 inserted into the funnel-shaped cavities 6 can also be discerned in FIG. 1. The solder agglomerations serving as through-plating from the multilayer wiring 5 to the underside of the multichip module.

The production of a multichip module according to the invention starts with the application of the multilayer wiring 5, preferably with four conductor track planes, to the silicon carrier substrate 4. In the next production step, the small solder balls 2 are applied to the multilayer wiring 5, preferably by electrodeposition. The structuring of the carrier substrate 4 then takes place, that is to say full development and deep etching, for example using the liquid etchant KOH. Depending on the material properties and thickness of the carrier substrate 4, a desired angle of the funnel in the carrier substrate 4 can be established relatively well. The funnel-shaped cavities 6 illustrated in FIG. 1 result, into which solder agglomerations 7 are subsequently introduced mechanically, the cavities 6 resulting in greater stability due to improved lateral retention of the solder agglomerations 7 by comparison with the solder agglomerations which are conventionally fixed only by means of pads. This is advantageous with regard to the shear forces that occur during thermal expansions. Finally, in a further production step, the chips 1 are soldered onto the small solder balls 2 that are already present. This is done, therefore, by flip-chip mounting of the chips 1 directly onto the carrier substrate 4. The resulting multichip modules can be soldered into another assembly by means of Surface Mounted Devices (SMD) mounting via their solder agglomerations 7.

On account of the greater or lesser conductivity of the silicon carrier substrate 4, it is normally necessary to cover the inclined sides of the structured cavities 6 (in other words not the bottom of the cavity 6, i.e. the contact with the multilayer wiring 3) with an insulating layer before the solder agglomerations 7 are introduced. This can advantageously be achieved most simply by means of a poorly planarizing material, for example photoimide. By contrast, a readily planarizing material would, undesirably, not only cover the inclined sides, that is to say the inner surface of the funnel, but completely fill the latter.

Figure 2:
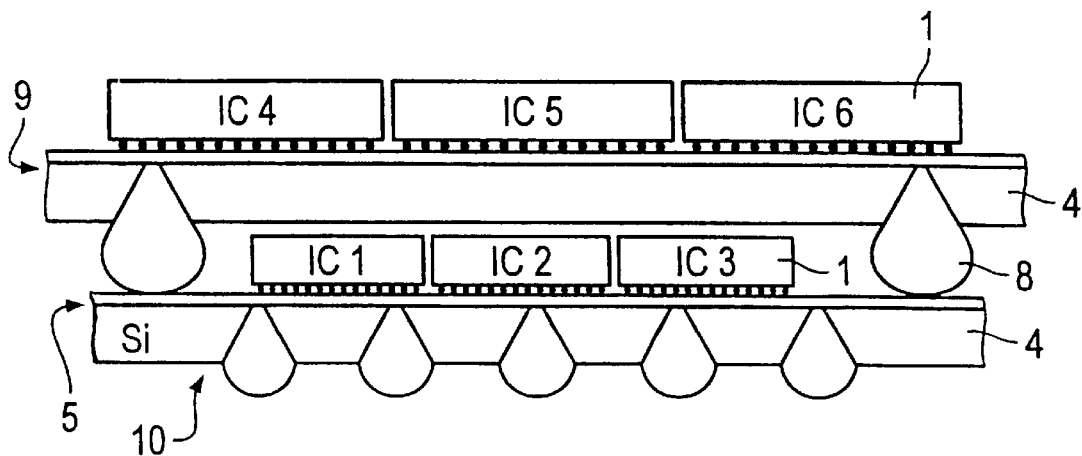
FIG. 2 is a similar view of a further embodiment of the multi-chip module according to the invention.

Referring now to FIG. 2, there is shown a sandwich multichip module, in which the solder agglomerations 8 of the upper module 9 are not arranged areally but only in the outer region of the upper carrier substrate 4 and are soldered directly on the multilayer wiring 5 of the lower module 10. This presupposes, as indicated in FIG. 2, that the solder agglomerations 8 are large enough or thick enough for there to be sufficient space for the chips 1—arranged in the central region—of the lower multichip module 10.

The multichip module according to the invention can be produced with a low outlay since a uniform silicon carrier substrate 4 is used and, in particular, fewer processing steps are incurred in comparison with the prior art mentioned in the introduction. Furthermore, space advantages are afforded by the flip-chip mounting of the chips 1, as a result of which the spacing of the latter may be very small. Lastly, short connections from the chips 1 to the external assembly are also produced. Finally, the multichip module according to the invention also generally enables a three-dimensional packaging, as described for FIG. 2 only by way of example using the specific embodiment therein.

I claim:

1. A multichip module, comprising:
    a silicon carrier substrate having a mounting side and an underside;
    multilayer wiring applied to said mounting side of said carrier substrate, said multilayer wiring including a first, uppermost conductor track plane and a lowermost conductor track plane;
    at least one semiconductor chip in contact with said first, uppermost conductor track plane and flip-chip mounted thereon via a plurality of small solder balls; and
    said underside of said carrier substrate having formed therein a plurality of cavities narrowing in a funnel shape from said underside and to said lowermost conductor track plane; and
    a plurality of soldering contacts each in the form of a solder agglomeration disposed in a respective one of said cavities and extending from said underside to said lowermost conductor track plane, for electrically connecting the multichip module to a mounting rack.

2. The multichip module according to claim 1, wherein said solder agglomerations include ball grid array solder agglomerations, said ball grid array solder agglomerations being areally disposed.

3. The multichip module according to claim 1, wherein said cavities having inclined sides each covered with an insulating layer composed of a poorly planarizing material.

4. The multichip module according to claim 3, wherein said poorly planarizing material is photoimide.

5. A multichip module assembly, comprising two multichip modules according to claim 1, including a lower module and an upper module arranged on said lower module, wherein said solder agglomerations of said upper module are arranged only in outer region of said carrier substrate and are soldered directly on said multilayer wiring of said lower module.

* * * * *